United States Patent
Kim et al.

(10) Patent No.: US 9,911,883 B2
(45) Date of Patent: Mar. 6, 2018

(54) ELECTRIC ENERGY HARVESTER FOR DISPLAY PANEL

(71) Applicant: RESEARCH & BUSINESS FOUNDATION SUNGKYUNKWAN UNIVERSITY, Suwon-si (KR)

(72) Inventors: Sang Woo Kim, Yongin-si (KR); Kang Hyuck Lee, Suwon-si (KR); Hey Jung Park, Seoul (KR); Sung Kyun Kim, Suwon-si (KR); Tae Yun Kim, Incheon (KR); Hong Joon Yoon, Goyang-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/379,833

(22) Filed: Dec. 15, 2016

(65) Prior Publication Data
US 2017/0170351 A1    Jun. 15, 2017

(30) Foreign Application Priority Data
Dec. 15, 2015 (KR) .......... 10-2015-0178943

(51) Int. Cl.
| H01L 31/044 | (2014.01) |
| H01L 31/054 | (2014.01) |
| H02S 10/10 | (2014.01) |
| H01L 41/113 | (2006.01) |
| H01L 41/18 | (2006.01) |

(52) U.S. Cl.
CPC ........ *H01L 31/0547* (2014.12); *H01L 41/113* (2013.01); *H01L 41/183* (2013.01); *H02S 10/10* (2014.12); *Y02E 10/52* (2013.01)

(58) Field of Classification Search
CPC ........ H01L 31/00–31/078; Y02E 10/50–10/60
USPC .................................. 136/243–265
See application file for complete search history.

(56) References Cited

U.S. PATENT DOCUMENTS

| 8,981,213 | B1 * | 3/2015 | Micallef | H01L 41/113 136/243 |
| 2010/0072859 | A1 * | 3/2010 | Jager | H01L 41/1138 310/323.21 |
| 2011/0050042 | A1 * | 3/2011 | Choi | H01L 41/37 310/339 |
| 2012/0216847 | A1 * | 8/2012 | Kumar | H01L 37/02 136/201 |
| 2016/0172612 | A1 * | 6/2016 | Carroll | B82Y 10/00 136/263 |

* cited by examiner

*Primary Examiner* — Bach T Dinh
(74) *Attorney, Agent, or Firm* — NSIP Law

(57) ABSTRACT

There is provided an electrical-energy harvester for a display panel, the harvester comprising: a transparent and flexible lower electrode; a transparent and flexible piezoelectric layer on the lower electrode; reflective particles dispersed in the piezoelectric layer for reflecting light beams incident into the piezoelectric layer; a transparent and flexible upper electrode on the piezoelectric layer, wherein the upper and lower electrodes are opposite to each other; and at least one solar cell disposed on at least one lateral side of the piezoelectric layer, wherein at least one solar cell is configured to receive the light beam reflected from the reflective particles and, thus, to generate electrical energy.

7 Claims, 9 Drawing Sheets

| QD (mg) | $V_{oc}$ (V) | $I_{sc}$(mA) / $J_{sc}$ (mA/cm$^2$) | $P_{max}$ (mW) | FF (%) |
|---|---|---|---|---|
| 0.0 | 0.510 | 2.865 / 1.246 | 0.77 | 0.527 |
| 6.75 | 0.524 | 3.776 / 1.642 | 1.128 | 0.570 |
| 13.5 | 0.534 | 4.742 / 2.062 | 1.523 | 0.602 |
| 20.3 | 0.540 | 5.721 / 2.487 | 1.904 | 0.616 |
| 27.0 | 0.548 | 7.049 / 3.065 | 2.426 | 0.628 |

[FIG. 6]

ELECTRIC ENERGY HARVESTER FOR DISPLAY PANEL

CROSS-REFERENCE TO RELATED APPLICATION

This application claims the benefit of Korea patent application No. 10-2015-0178943 filed on Dec. 15, 2015, the entire content of which is incorporated herein by reference for all purposes as if fully set forth herein.

BACKGROUND

Field of the Present Disclosure

The present disclosure relates to an electrical energy harvester, and, more particularly, to an electrical-energy harvester for a display panel wherein the harvester is disposed on the display panel surface and is flexible and transparent and is configured to generate electrical energy upon receipt of optical energy and/or physical force.

Discussion of Related Art

As electronic devices using displays are becoming commonplace and technologies thereof are developed, the thickness of electronic devices is thinned, the resolution of displays is improved, and the amount of electric energy consumed is increasing. In this connection, the proportion of the volume occupied by batteries in electronic devices is gradually increasing.

However, the bulkiness may reduce the portability and ease of use of the devices. Thus, there is a limit to increase the volume of the battery, so that a new alternative capable of supplying electricity to the electronic devices using the display is required. Since solar light is close to an almost infinite energy source, solar cells have been developed actively to utilize them. Thus, it may be considered to supply electric energy to electronic devices using displays using such solar cells.

For example, solar cells in conventional solar-based displays are not transparent and thus have a problem in that they are very inefficient due lower energy generation since the solar cells are the side or back of the display. In addition, when the weather is cloudy or rainy, the efficiency of the solar cell is rapidly lowered. Therefore, there is a problem that the solar cell is less commercialized because it generates less electric energy compared to the facility cost.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

From the above fact, the present applicants have conceived a novel energy harvester using indoor lighting, especially, light beams emitted from the display devices.

The present disclosure is to provide an electrical-energy harvester for a display panel wherein the harvester is disposed on the display panel surface and is flexible and transparent and is configured to generate electrical energy upon receipt of optical energy and/or physical force.

In one aspect of the present disclosure, there is provided an electrical-energy harvester for a display panel, the harvester comprising: a transparent and flexible lower electrode; a transparent and flexible piezoelectric layer on the lower electrode; reflective particles dispersed in the piezoelectric layer for reflecting light beams incident into the piezoelectric layer; a transparent and flexible upper electrode on the piezoelectric layer, wherein the upper and lower electrodes are opposite to each other; and at least one solar cell disposed on at least one lateral side of the piezoelectric layer, wherein at least one solar cell is configured to receive the light beam reflected from the reflective particles and, thus, to generate electrical energy.

In one implementation, the electrical-energy harvester is disposed on a surface of the display panel surface.

In one implementation, the reflective particles comprise: at least two rows of first reflective particles regularly arranged in a parallel direction to a length direction of the piezoelectric layer; and at least two rows of second reflective particles regularly arranged in a parallel direction to a length direction of the piezoelectric layer, wherein the second reflective particles are disposed between the first reflective particles.

In one implementation, the harvester further comprise a first leading line electrically coupled to the solar cell; and a second leading line electrically coupled to the lower electrode and upper electrode.

In one implementation, the first leading line and second leading is electrically coupled to the display panel.

In one implementation, each of the reflective particles is formed of a sphere or faceted sphere.

In one implementation, the reflective particles is regularly arranged in a staggered manner.

In accordance with the present disclosure, it may be possible to continuously supply electric energy to a display panel that continuously consumes power without being limited by time and space and can charge the battery connected to the display panel to improve the efficiency of the battery.

Further, it may have an advantage that it is possible to continuously generate electric energy indoor when the sunlight is not irradiated or when the intensity of the sunlight to be irradiated is weak because the electric energy can be generated using the piezoelectric material layer by applying the force. In addition, using the solar cell capable of sufficiently generating electric energy even in an indoor lighting environment, it is possible to generate electric energy continuously.

Moreover, it may have an advantage that it is possible to generate electric energy by sunlight or generate electric energy by indoor lighting. When indoor lighting is weak, it generates electric energy by the piezoelectric effect, thereby generating electric energy continuously.

The present disclosure has the effect of generating electric energy even by a touch or a small force.

The present disclosure has the effect of increasing the amount of electric energy generated from the solar cell by reflecting light and increasing the amount of light transmitted to the solar cell.

Since the present harvester has transparent and flexible characteristics, it can be used in various applications such as a mobile display, a smart watch, and a smart window, which are next generation display devices.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Further, the use of "may" when describing embodiments of the present disclosure refers to "one or more embodiments of the present disclosure."

Figure 1:
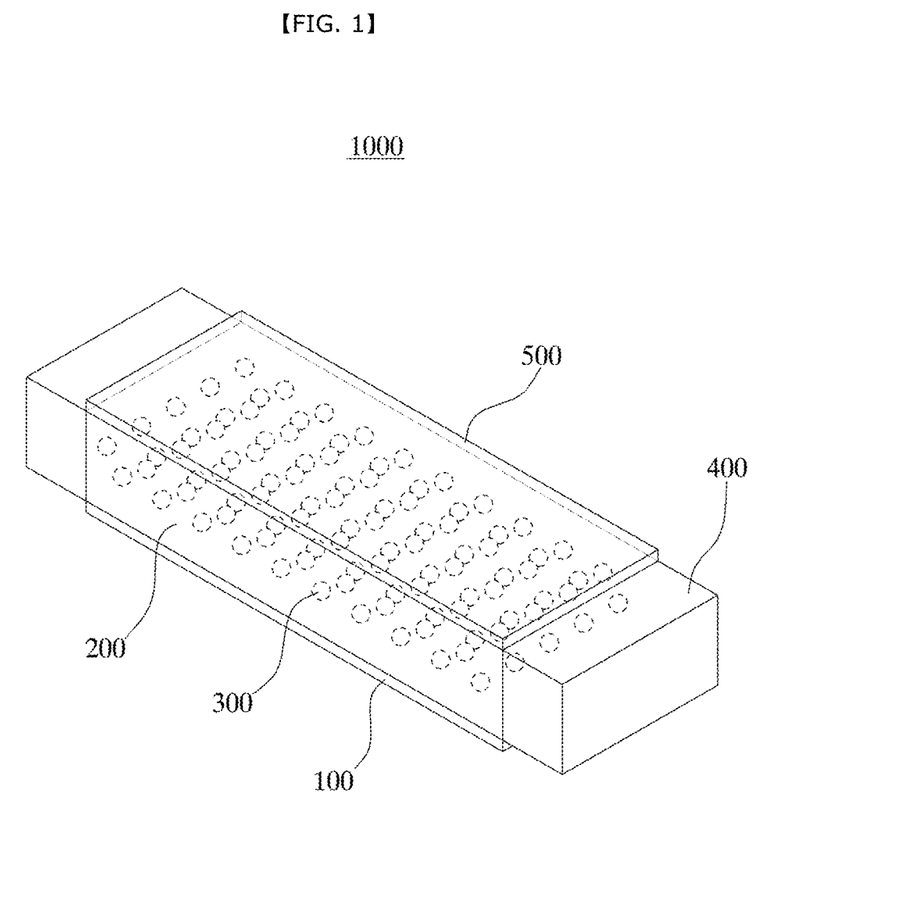
FIG. 1 is a schematic diagram of an electrical-energy harvester for a display panel in accordance with one embodiment of the present disclosure.

FIG. 1 is a schematic diagram of an electrical-energy harvester for a display panel in accordance with one embodiment of the present disclosure.

Referring to FIG. 1, an electrical-energy harvester 1000 for a display panel in accordance with one embodiment of the present disclosure may include a lower electrode 100, a piezoelectric layer 200, a reflective particles 300, at least one solar cell 400, and an upper electrode 500. In one implementation, the electrical-energy harvester 1000 for a display panel may be disposed on a display panel surface. Light beams from the display panel may pass through the electrical-energy harvester 1000 for a display panel and emit out of the harvester.

The lower electrode 100 may be made of a transparent and flexible material. The lower electrode 100 may be disposed on a display panel surface. Since the lower electrode 100 is made of a transparent and flexible material, light beams from the display panel may pass through the lower electrode 100. Further, the lower electrode 100 may be deformable. In one implementation, the lower electrode 100 may be made of ITO, graphene, etc. However, the present disclosure is not limited thereto.

The piezoelectric layer 200 may be dispose on the lower electrode 100 and may be made of a transparent and flexible piezoelectric material. When a physical force is applied to the piezoelectric layer 200 to deform the mechanical deformation thereof, the piezoelectric layer 200 may generate electrical energy. In one implementation, the piezoelectric layer 200 may be made of PVDF, P(VDF-TrFE) etc. In one implementation, when the piezoelectric layer 200 is pressured or bent, the piezoelectric layer 200 may generate the electrical energy.

The reflective particles 300 may be dispersed in the piezoelectric layer 200. The reflective particles 300 may reflect the light beams passing through the piezoelectric layer 200. The reflective particles 300 may refract the light beams which, in turn, may be transferred to the solar cell 400. In one implementation, each of the reflective particles 300 may be formed of a quantum dot made of a single material or a core/shell structure. For example, quantum dot may be made of II-VI group compounds (CdSe, CdS, CdTe, ZnSe, ZnS, ZnTe, ZnO, HgS, HgSe, HgTe, etc.), III-V group compounds (GaN, GaP, GaAs, GaSb, AlN, AlP, AlAs, AlSb, InN, InP, InAs, InSb, etc.), IV-VI group compounds (SnS, SnSe, SnTe, PbS, PbSe, PbTe, etc.) or I-III-V group compounds ($CuGaS_2$, $CuGaSe_2$, $CuInS_2$, $CuInSe_2$ etc.).

In one implementation, the reflective particles 300 may include at least two rows of first reflective particles 310 regularly arranged in a parallel direction to a length direction of the piezoelectric layer 200, and at least two rows of second reflective particles 310 regularly arranged in a parallel direction to a length direction of the piezoelectric layer 200, wherein the second reflective particles may be disposed between the first reflective particles. Further, each of the reflective particles 300 may be formed of a sphere or faceted sphere.

The solar cell 400 may be at least one. At least one solar cell 400 may be disposed on at least one side faces of the piezoelectric layer 200. The solar cell 400 may be configured to receive the light beams reflected from the reflective particles 400 and to generate the electrical energy. In one implementation, the solar cell 400 may include a light absorber to absorb a wide band of a wavelength of the light beams. In one implementation, the solar cell 400 may be configured to generate the electrical energy using the indoor illumination. In one implementation, the solar cell 400 may include a Si solar cell, a GaAs solar cell, or a Perovskite solar cell, etc.

In one implementation, each solar cell 400 may be disposed on each of four side faces of the piezoelectric layer 200 on which the lower and upper electrodes are not disposed. In one implementation, a plurality of solar cells 400 may be disposed on a single side face of the piezoelectric layer 200. However, the present disclosure may not be limited thereto. The arrangement of the solar cells 400 may depend on a target amount of electrical energy.

The upper electrode 500 may be made of a transparent and flexible material. The upper electrode 500 may be disposed on the piezoelectric layer 200. Since the upper electrode 500 is made of a transparent and flexible material, light beams may pass through the upper electrode 500. Further, the upper electrode 500 may be deformable. In one implementation, the upper electrode 500 may be made of ITO, graphene, etc. However, the present disclosure is not limited thereto.

In order to use electrical energy generated from the electrical-energy harvester 1000 for a display panel in accordance with one embodiment of the present disclosure, the electrical-energy harvester 1000 for a display panel may further comprise a first leading line (not shown) electrically coupled to the solar cell 400 and a second leading line (not shown) electrically coupled to the lower electrode 100 and upper electrode 500. In one implementation, the first leading line and second leading line may be electrically coupled to the display panel, such that the current may flow via the first leading line and second leading line to the display panel. In one implementation, the first leading line and second leading line may be electrically coupled to a battery for supplying a power to the display panel.

Figure 2:
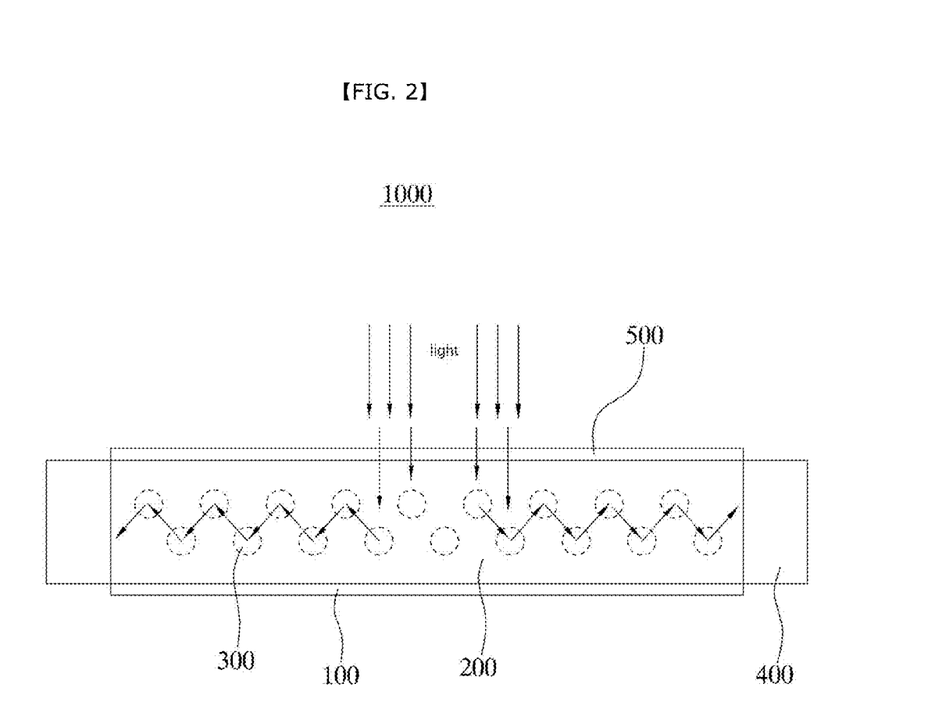
FIG. 2 is a side-elevation view of the present electrical-energy harvester for describing how the light beam is transferred to the solar cell.

FIG. 2 is a side-elevation view of the present electrical-energy harvester for describing how the light beam is transferred to the solar cell.

Referring to FIG. 2, in one implementation, light beams may pass through the upper electrode 500 and then may be reflected from the reflective particles 300 toward both sides of the piezoelectric layer 300 and then may be incident into both solar cells 400. In this way, the solar cell 400 may generate the electrical energy.

Figure 3:
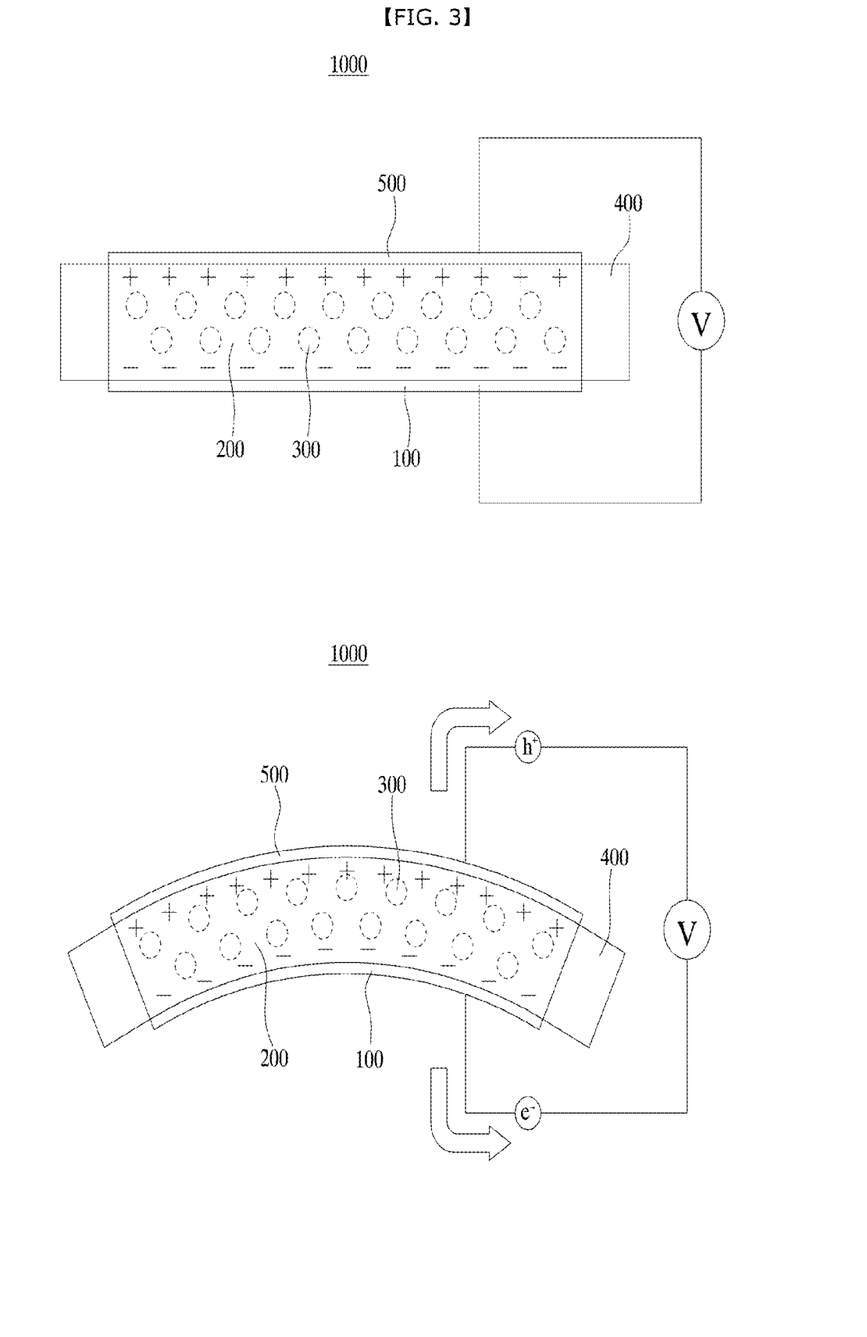
FIG. 3 shows side-elevation views of the present electrical-energy harvester for describing electrical energy generation via deformation of the electrical-energy harvester.

FIG. 3 shows side-elevation views of the present electrical-energy harvester for describing electrical energy generation via deformation of the electrical-energy harvester.

Referring to FIG. 3, when the electrical-energy harvester is pressured or vibrated, the piezoelectric layer 200 may be mechanically deformed, thereby to allow the piezoelectric layer 200 to generate the electrical energy. Further, when the electrical-energy harvester 1000 for a display panel is bent, and thus, the piezoelectric layer 200 is bent, the piezoelectric layer 200 may generate the electrical energy.

The lower electrode 100, the piezoelectric layer 200, the reflective particles 300, the at least one solar cell 400 and the upper electrode 500 all may be made of materials with good mechanical stability such that the electrical-energy harvester 1000 for a display panel may not be damaged due to the large degree of bending thereof. Further, the display panel on which the electrical-energy harvester 1000 is disposed may be flexible.

Hereinafter, one example implementation of the present disclosure may be illustrated.

EXAMPLE

A piezoelectric layer containing therein reflective particles is prepared. Hereinafter, this piezoelectric layer containing therein reflective particles is referred to as a "light guide layer". As for the light guide layer, the reflective particles are made of quantum dots (QDs) and the piezoelectric layer material is selected as a P(VDF-TrFE)(poly (vinylidenefluoride-co-trifluoroethylene).

Figure 4A:
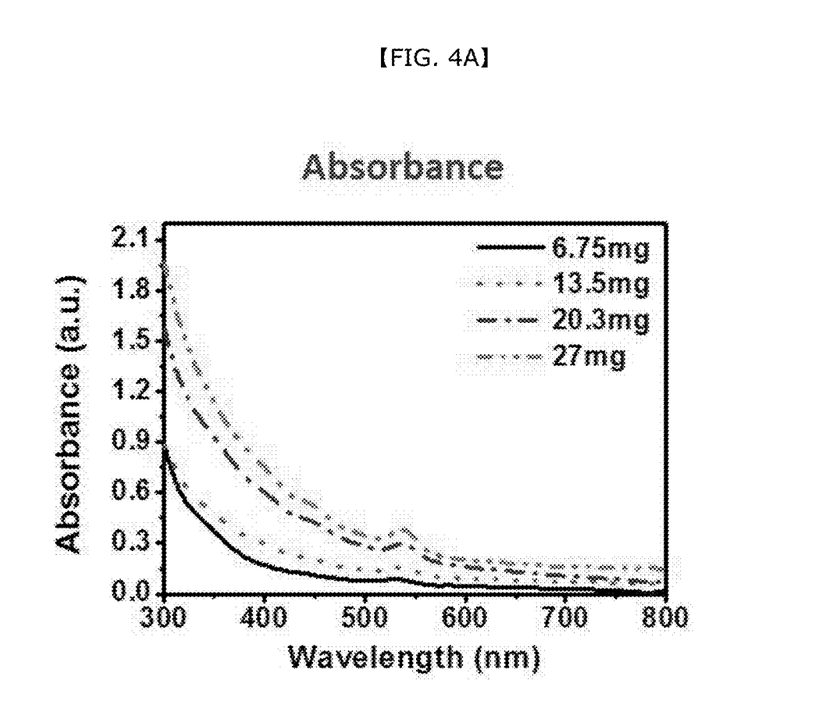
FIG. 4A-4C show optical properties of the light guide layer.
Figure 4B:
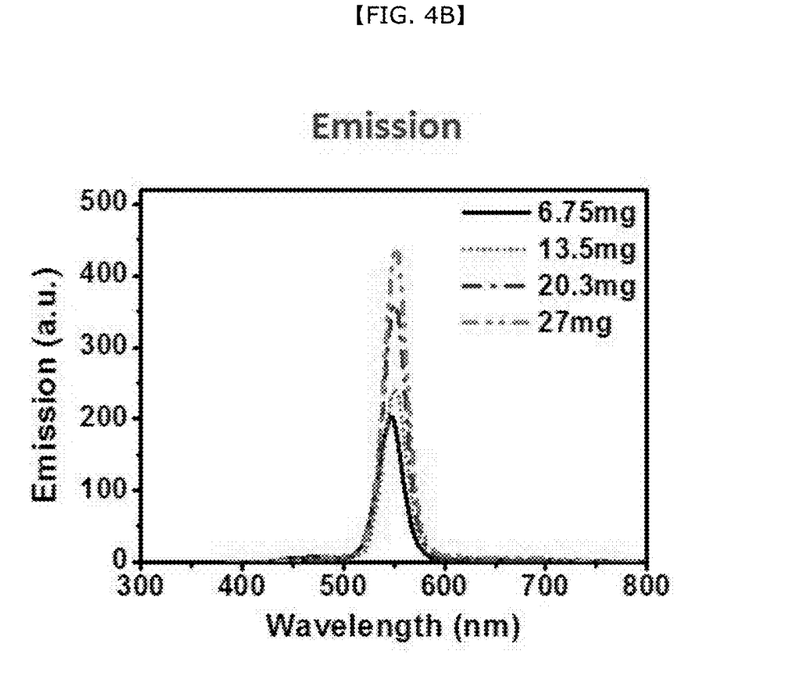
Figure 4C:
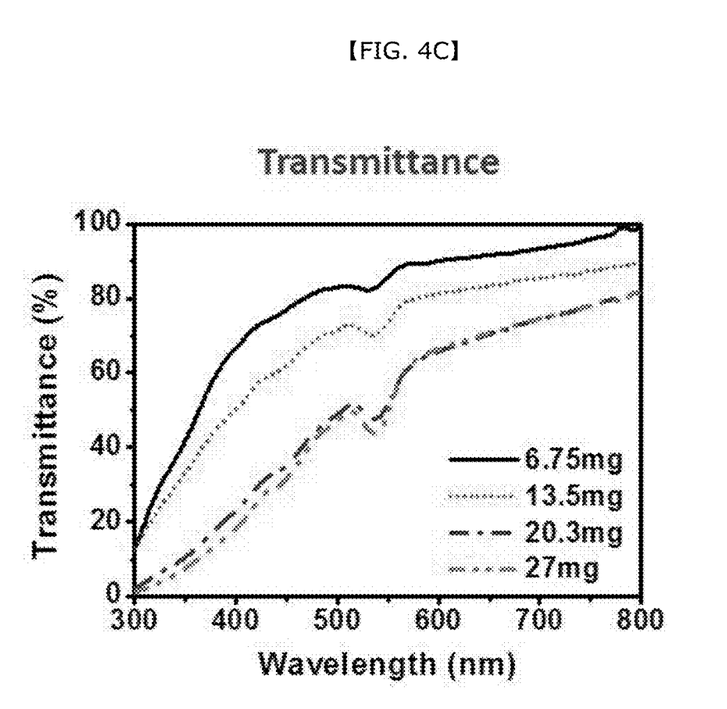

The light guide layer is measured in terms of optical properties. The results thereof are shown in FIG. 4A-4C. In this measurement, a light beam having 300-800 nm wavelength is irradiated to the light guide layer using Shimadzu UV-VIS-NIR UV-3600. As shown FIG. 4A-4C, as a concentration of quantum dots increases, emission and transmittance of the light beams decrease for specific wavelengths. FIG. 4A shows that quantum dots (CdSe/ZnS core/shell structures) are good at absorbing the light beams having wavelengths (UV light) smaller than or equal to 400 nm, and, thus, the absorbance for the light beams having wavelengths smaller than or equal to 400 nm increases. As the concentration of the quantum dots increases, the absorbance increases proportionally. FIG. 4B shows that quantum dots (CdSe/ZnS core/shell structures) are good at emitting the light beams having the wavelength 550 nm. As the concentration of the quantum dots increases, the emission for light beams having the wavelength 550 nm increases. FIG. 4C shows that the quantum dots (CdSe/ZnS core/shell structures) are good at absorbing the light beams having wavelengths (UV light) smaller than or equal to 400 nm, and, thus, the transmittance for the light beams having wavelengths smaller than or equal to 400 nm deceases. As the concentration of the quantum dots increases, the transmittance decreases proportionally.

Figure 5A:
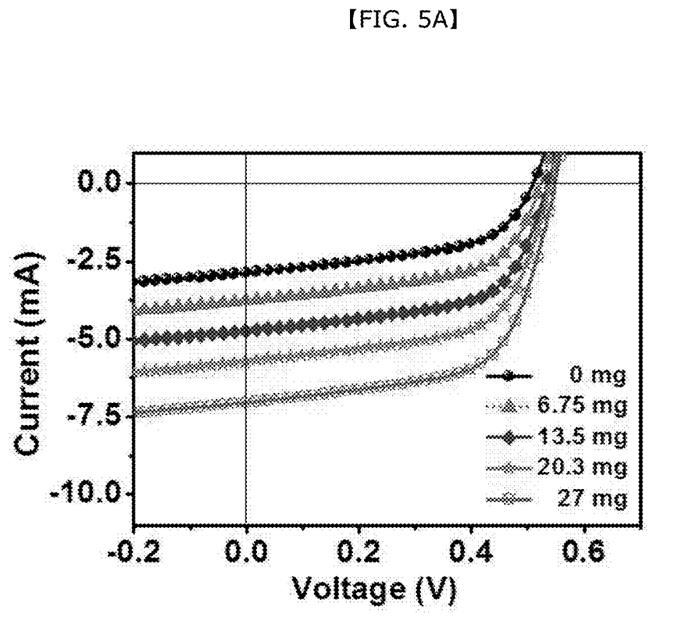
FIG. 5A-5B indicate experimental data for an electrical-energy harvester for a display panel in one example of the present disclosure.
Figure 5B:
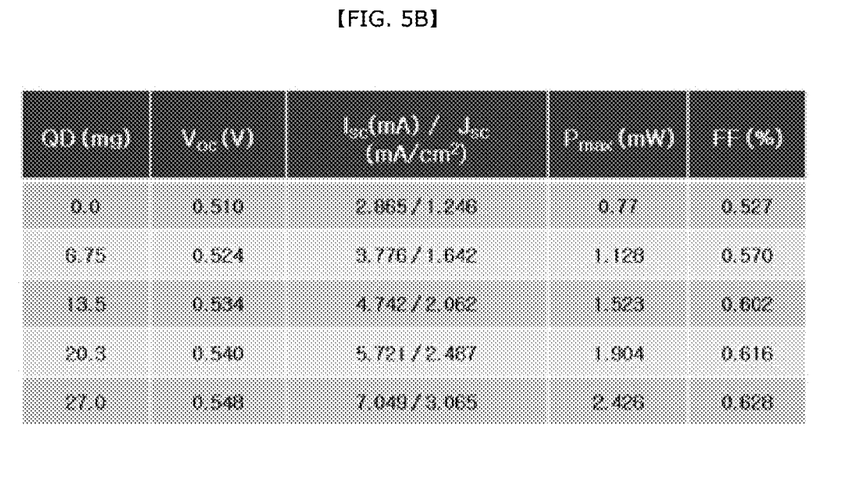

FIG. 5A-5B indicate experimental data for an electrical-energy harvester for a display panel in one example. The electrical-energy harvester for a display panel in this example includes the upper electrode made of AgNW, the light guide layer including the reflective particles made of quantum dots (QDs) and the piezoelectric layer material selected as a P(VDF-TrFE)(poly(vinylidenefluoride-co-trifluoroethylene), the lower electrode made of ITO, a substrate formed of PEN(a polymer substrate on which ITO is deposited), and c-Si solar cells formed on both sides of the light guide layer. As shown in FIGS. 5A and 5B, it is seen that as the concentration of the quantum dots increases, an amount of light beam flux transferred to the c-Si solar cells increases.

Figure 6:
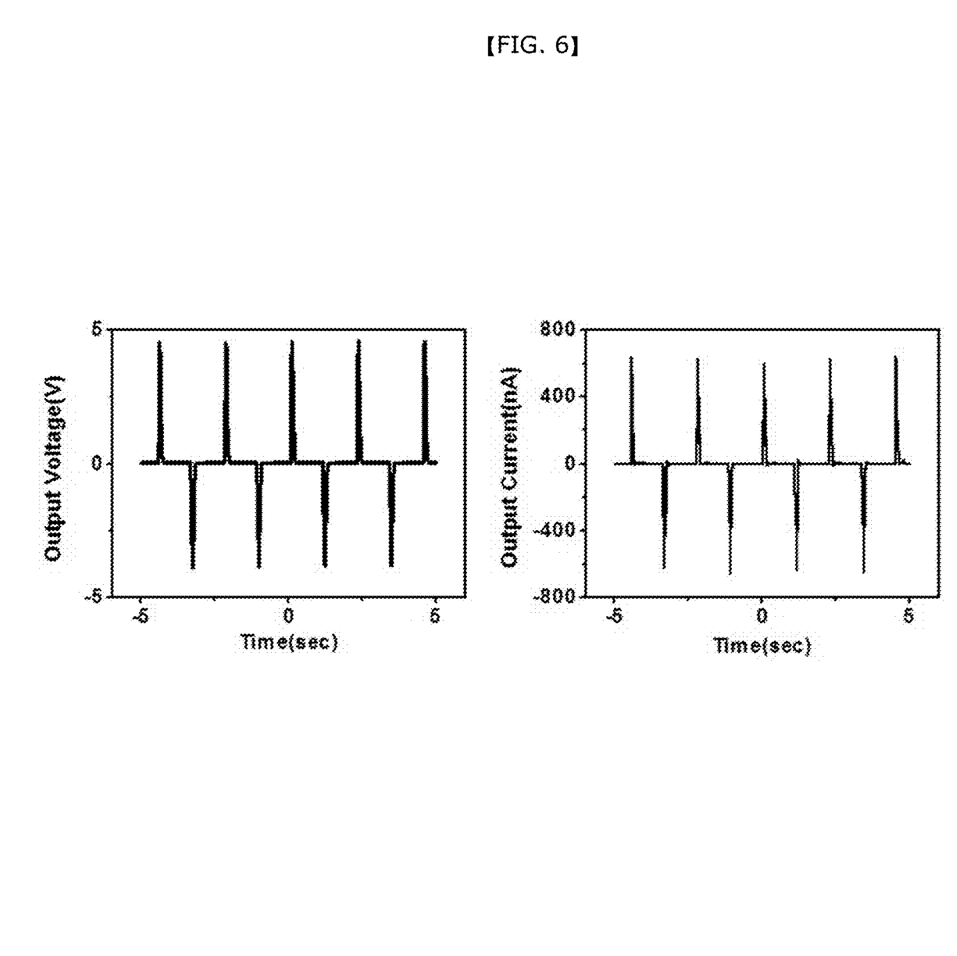
FIG. 6 indicates electrical energy generation from the electrical-energy harvester for a display panel in the example with reference to FIG. 5A-5B when an external force is applied to the light guide layer.

FIG. 6 indicates electrical energy generation from the electrical-energy harvester for a display panel in the example with reference to FIG. 5A-5B when an external force is applied to the light guide layer. When an external force is pressured using a finger (the force <0.5 kgf), the piezoelectric layer material selected as the P(VDF-TrFE) (poly(vinylidenefluoride-co-trifluoroethylene) generates the electrical-energy as shown in FIG. 6.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one implementation," "an implementation," or similar language means that a particular feature, structure, or characteristic that is described in connection with the embodiment is included in at least one embodiment of the present disclosure. Thus, appearances of the phrases "in one implementation," "in an implementation," and similar language throughout this specification may, but do not necessarily, all refer to the same embodiment.

What is claimed is:

1. An electrical-energy harvester for a display panel, the harvester comprising:
   a transparent and flexible lower electrode;
   a transparent and flexible piezoelectric layer on the lower electrode;
   reflective particles dispersed in the piezoelectric layer for reflecting light beams incident into the piezoelectric layer;
   a transparent and flexible upper electrode on the piezoelectric layer, wherein the upper and lower electrodes are opposite to each other; and
   at least one solar cell disposed on at least one lateral side of the piezoelectric layer, wherein at least one solar cell is configured to receive the light beam reflected from the reflective particles and, thus, to generate electrical energy.

2. The harvester of claim 1, wherein the electrical-energy harvester is disposed on a surface of the display panel surface.

3. The harvester of claim 1, wherein the reflective particles comprise:
   at least two rows of first reflective particles regularly arranged in a parallel direction to a length direction of the piezoelectric layer; and
   at least two rows of second reflective particles regularly arranged in a parallel direction to a length direction of the piezoelectric layer, wherein the second reflective particles are disposed between the first reflective particles.

4. The harvester of claim 2, further comprising:
   a first leading line electrically coupled to the solar cell; and
   a second leading line electrically coupled to the lower electrode and upper electrode.

5. The harvester of claim 4, wherein the first leading line and second leading is electrically coupled to the display panel.

6. The harvester of claim 1, wherein each of the reflective particles is formed of a sphere or faceted sphere.

7. The harvester of claim 1, wherein the reflective particles is regularly arranged in a staggered manner.

* * * * *